(12) United States Patent
Furukawa

(10) Patent No.: US 9,590,285 B2
(45) Date of Patent: Mar. 7, 2017

(54) WAVEGUIDE BANDPASS FILTER HAVING A LADDER SHAPE METAL PLATE AND WHICH IS TUNABLE USING A ROTATABLE DIELECTRIC PLATE

(71) Applicant: NEC Corporation, Tokyo (JP)

(72) Inventor: Eiichi Furukawa, Tokyo (JP)

(73) Assignee: NEC Corporation, Tokyo (JP)

( * ) Notice: Subject to any disclaimer, the term of this patent is extended or adjusted under 35 U.S.C. 154(b) by 125 days.

(21) Appl. No.: 14/401,883

(22) PCT Filed: Apr. 18, 2013

(86) PCT No.: PCT/JP2013/062152
§ 371 (c)(1),
(2) Date: Nov. 18, 2014

(87) PCT Pub. No.: WO2013/187139
PCT Pub. Date: Dec. 19, 2013

(65) Prior Publication Data
US 2015/0155610 A1    Jun. 4, 2015

(30) Foreign Application Priority Data
Jun. 12, 2012    (JP) .................................. 2012-132585

(51) Int. Cl.
*H01P 1/207*    (2006.01)
*H01P 1/20*    (2006.01)
(Continued)

(52) U.S. Cl.
CPC ............ *H01P 1/207* (2013.01); *H01P 1/2002* (2013.01); *H01P 3/122* (2013.01); *H03J 1/08* (2013.01)

(58) Field of Classification Search
CPC .................................. H01P 1/207; H01P 3/12
(Continued)

(56) References Cited

U.S. PATENT DOCUMENTS 3,417,350 A   12/1968   Cruz
4,761,625 A    8/1988   Sharma
(Continued)

FOREIGN PATENT DOCUMENTS

EP    2448060 A    5/2012
GB     827021 A    1/1960
(Continued)

OTHER PUBLICATIONS

Extended European Search Report issued by the European Patent Office for Application No. 13804240.3 dated Oct. 20, 2015 (6 pages).

(Continued)

*Primary Examiner* — Benny Lee
(74) *Attorney, Agent, or Firm* — Wilmer Cutler Pickering Hale and Dorr LLP

(57) ABSTRACT

Provided is a bandpass filter (10), including: a filter casing (17) defining a rectangular waveguide (11) having a narrow plane (a) and a broad plane (b); a metal plate (12) having a ladder shape and being arranged in a sandwiched manner inside the filter casing (17) at a center of the broad plane (b) so as to be parallel to the narrow plane (a); a dielectric plate (13) positioned in a vicinity of the metal plate (12); a support rod (14) extending in parallel to a longitudinal direction of the rectangular waveguide (11), the support rod (14) being rotatably supported on the filter casing (17) and configured to support the dielectric plate (13); and a first gear (15) fixed at a tip of the support rod (14). The dielectric plate (13) is rotated along with rotation of the first gear (15), to thereby adjust a bandpass frequency.

5 Claims, 5 Drawing Sheets

(51) Int. Cl.
*H01P 3/12* (2006.01)
*H03J 1/08* (2006.01)
(58) Field of Classification Search
USPC .................................................. 333/207, 209
See application file for complete search history.

(56) References Cited

U.S. PATENT DOCUMENTS 7,449,981 B2 * 11/2008 Park ..................... H01P 1/2053
333/203
2012/0126914 A1    5/2012 Miyamoto et al.

FOREIGN PATENT DOCUMENTS

| JP | S56-15120 A | 2/1981 |
| JP | S56-15120 U | 2/1981 |
| JP | H03-90127 A | 4/1991 |
| JP | H03-90127 U | 9/1991 |
| JP | 2011-009806 A | 1/2011 |

OTHER PUBLICATIONS

International Search Report corresponding to PCT/JP2013/062152, mail date Jul. 30, 2013, 5 pages.
Partial English Translation of Written Opinion corresponding to PCT/JP2013/062152, mail date Jul. 30, 2013, 7 pages.

* cited by examiner

ND PASS FILTER HAVING A
WAVEGUIDE BANDPASS FILTER HAVING A LADDER SHAPE METAL PLATE AND WHICH IS TUNABLE USING A ROTATABLE DIELECTRIC PLATE

CROSS-REFERENCE TO RELATED APPLICATIONS

This application is a national stage application of International Application No. PCT/JP2013/062152 entitled "BANDPASS FILTER FOR WHICH BANDPASS FREQUENCY CAN BE EASILY CHANGED" filed on Apr. 18, 2013, which claims priority to Japanese Application No. 2012-132585 filed Jun. 12, 2012, the disclosures of which are hereby incorporated by reference in their entirety.

TECHNICAL FIELD

This invention relates to a tunable bandpass filter capable of changing a frequency.

BACKGROUND ART

Normally, a center frequency in a pass band is stationary in a bandpass filter. In a case where the center frequency is changed in the bandpass filter, there is no alternative but to replace the bandpass filter itself, or to adjust the center frequency again through replacement of an internal element of the bandpass filter.

In such a background, there have been proposed a lot of ideas of a tunable bandpass filter capable of automatically changing the center frequency. However, the tunable bandpass filter requires high cost, a complicated mechanism, and a large scale of peripheral circuitry, and hence the tunable bandpass filter is realizable but has not been often realized actually.

JP-A-2011-9806 (Patent Document 1) discloses the following tunable bandpass filter in FIGS. 1 to 5. Specifically, a metal plate having a ladder shape is provided in a rectangular waveguide, and thus the tunable bandpass filter attains filter characteristics. Further, a dielectric plate is provided in the rectangular waveguide, and a positional relationship of the dielectric plate is changed with respect to the metal plate. Thus, the tunable bandpass filter can change the center frequency. Further, Patent Document 1 further discloses use of a stepping motor as a drive unit for driving the dielectric plate. In addition, Patent Document 1 discloses, in [Claim 6], a matter that the drive unit is controlled by a computer based on predetermined information, to thereby change a relative positional relationship between the dielectric plate and the metal plate.

PRIOR ART DOCUMENT

Patent Document
Patent Document 1: JP-A-2011-9806

SUMMARY OF THE INVENTION

Problems to be Solved by the Invention

As described above, Patent Document 1 discloses the matter that the stepping motor is used as the drive unit, and the matter that the drive unit is controlled by the computer based on predetermined information, to thereby change the relative positional relationship between the dielectric plate and the metal plate. However, the use of the stepping motor and the computer leads to high cost, and the control method using the computer is complicated and difficult. Accordingly, the above-mentioned bandpass filter of Patent Document 1 using the stepping motor and the computer has not been able to be easily put to practical use.

Means to Solve the Problems

It is a first object of this invention to provide an inexpensive bandpass filter capable of easily changing a bandpass frequency.

It is a second object of this invention to provide a bandpass frequency adjusting method capable of easily changing the bandpass frequency in the bandpass filter.

According to one embodiment of this invention, there is provided a bandpass filter, including: a filter casing defining a rectangular waveguide having a narrow plane and a broad plane that is wider than the narrow plane; a metal plate having a ladder shape and being arranged in a sandwiched manner inside the filter casing at a center of the broad plane so as to be parallel to the narrow plane; a dielectric plate positioned in a vicinity of the metal plate in the rectangular waveguide; a support rod extending in parallel to a longitudinal direction of the rectangular waveguide, the support rod being rotatably supported on the filter casing and configured to support the dielectric plate so that the dielectric plate extends in the longitudinal direction of the rectangular waveguide; and a first gear fixed at a tip of the support rod, in which the dielectric plate is rotated along with rotation of the first gear, to thereby adjust a bandpass frequency.

Further, according to another embodiment of this invention, there is provided a bandpass frequency adjusting method to be used in a bandpass filter, the bandpass filter including: a filter casing defining a rectangular waveguide having a narrow plane and a broad plane that is wider than the narrow plane; a metal plate having a ladder shape and being arranged in a sandwiched manner inside the filter casing at a center of the broad plane so as to be parallel to the narrow plane; a dielectric plate positioned in a vicinity of the metal plate in the rectangular waveguide; and a support rod extending in parallel to a longitudinal direction of the rectangular waveguide, the support rod being rotatably supported on the filter casing and configured to support the dielectric plate so that the dielectric plate extends in the longitudinal direction of the rectangular waveguide, the bandpass frequency adjusting method including: fixing a first gear at a tip of the support rod; and rotating the dielectric plate along with rotation of the first gear, to thereby adjust a bandpass frequency.

Effect of the Invention

The bandpass filter according to one embodiment of this invention is an inexpensive bandpass filter capable of easily changing the bandpass frequency.

Further, the bandpass frequency adjusting method to be used in the bandpass filter according to one embodiment of this invention is capable of easily changing the bandpass frequency.

MODES FOR EMBODYING THE INVENTION

Next, embodiments of this invention are described in detail where like features in different drawing figures are denoted by the same reference numbers.

First Embodiment

Figure 1:
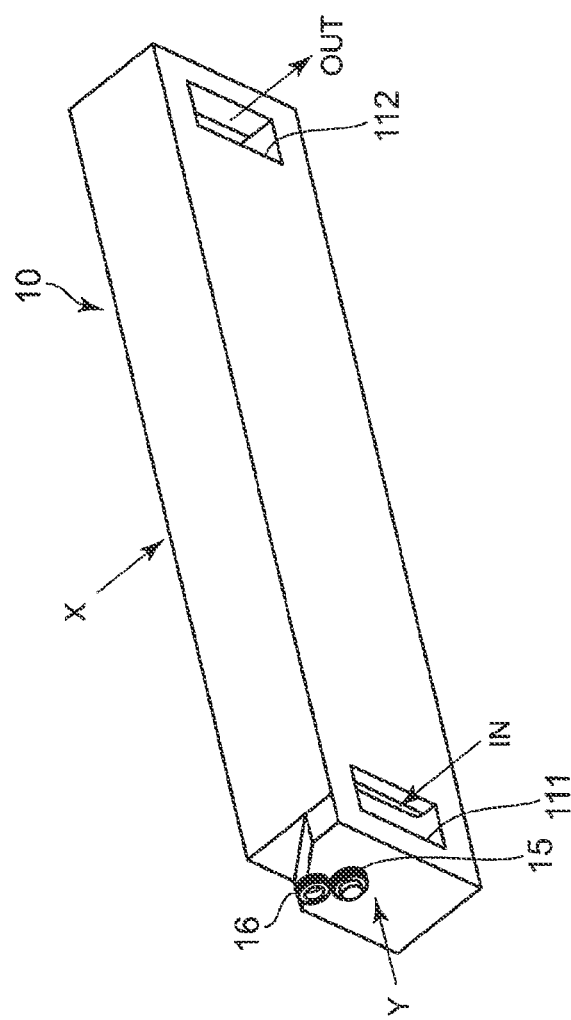
FIG. 1 is a view illustrating an external appearance of a bandpass filter according to a first embodiment of this invention.
Figure 2:
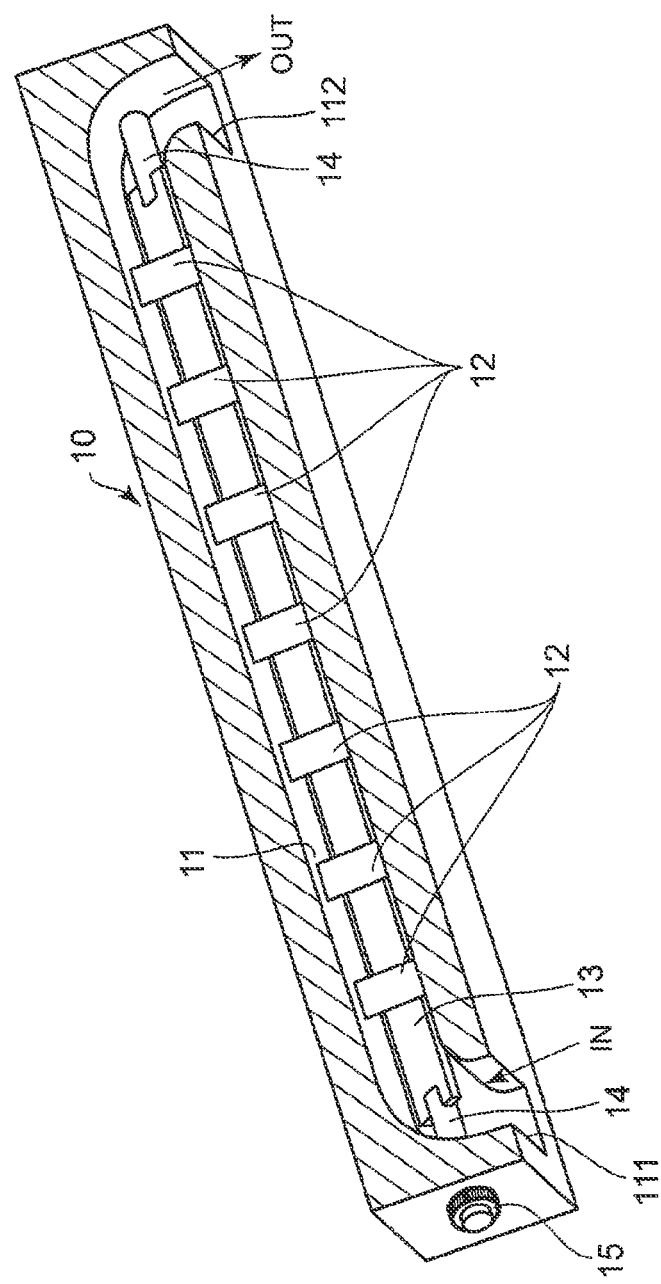
FIG. 2 is a cross-sectional view illustrating an interior of the bandpass filter illustrated in FIG. 1.

With reference to FIG. 1, an external appearance of a bandpass filter 10 according to a first embodiment of this invention is illustrated. FIG. 2 is a cross-sectional view illustrating an interior of the bandpass filter 10 illustrated in FIG. 1.

As illustrated in FIGS. 1 and 2, the bandpass filter 10 includes a rectangular waveguide 11 therein. The rectangular waveguide 11 includes an inlet portion 111 from which an input wave IN is input, and an outlet portion 112 from which an output wave OUT is output.

Figure 3:
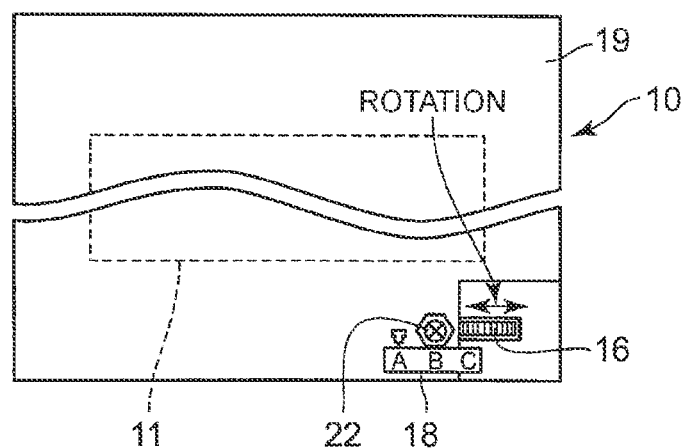
FIG. 3 is a view (top view) of the bandpass filter of FIG. 1 viewed from an X direction.
Figure 4A:
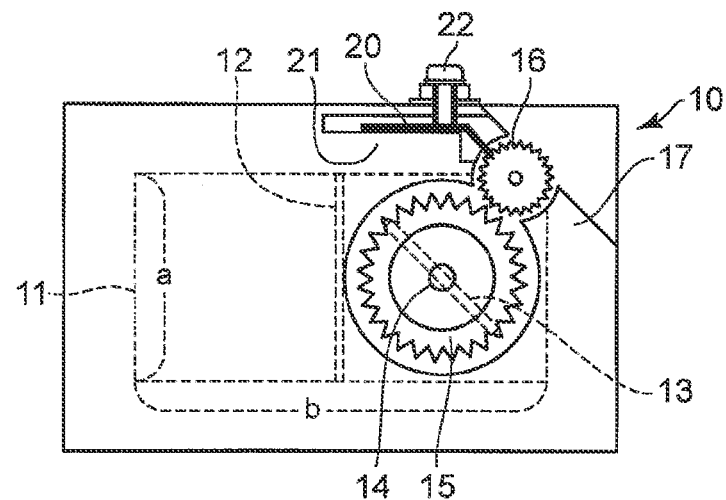
FIG. 4A is a view (side view) of the bandpass filter of FIG. 1 viewed from a Y direction, for illustrating a state in which a second gear is locked.
Figure 4B:
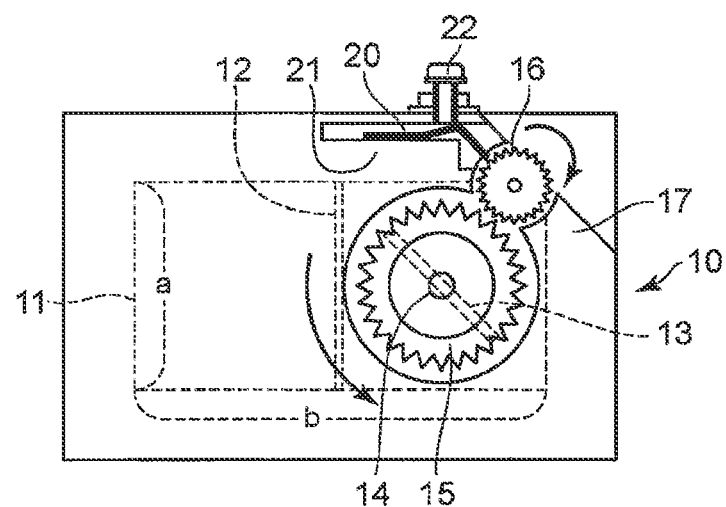
FIG. 4B is a view (side view) of the bandpass filter of FIG. 1 viewed from the Y direction, for illustrating a state in which the second gear is unlocked.

FIG. 3 is a view (top view) of the bandpass filter 10 of FIG. 1 viewed from an X direction. FIG. 4A is a view (side view) of the bandpass filter 10 of FIG. 1 viewed from a Y direction, for illustrating a state in which a second gear 16 (described later) is locked. FIG. 4B is a view (side view) of the bandpass filter 10 of FIG. 1 viewed from the Y direction, for illustrating a state in which the second gear 16 (described later) is unlocked.

As illustrated in FIGS. 4A and 4B, the rectangular waveguide 11 includes a rectangular waveguide path having a cross-section formed by a short side "a" and a long side "b" that is longer than the short side "a". In other words, the rectangular waveguide 11 includes the rectangular waveguide path having a narrow plane "a" and a broad plane "b" that is wider than the narrow plane "a". In order to communicate an inlet of the inlet portion 111 (FIGS. 1 and 2) and an outlet of the outlet portion 112 (FIGS. 1 and 2) to the rectangular waveguide path, the inlet portion 111 and the outlet portion 112 are respectively coupled to both ends of the rectangular waveguide 11.

As illustrated in FIGS. 2, 4A, and 4B, the bandpass filter 10 is formed of a fin line filter. That is, the bandpass filter 10 is formed of a fin line filter that attains characteristics as a bandpass filter in such a manner that a metal plate (fin line) 12 having a ladder shape is arranged in a sandwiched manner at a center of the long side "b" of the rectangular waveguide 11. In addition, in the bandpass filter 10, a dielectric plate 13 is provided in parallel to the metal plate (fin line) 12. A positional relationship between the dielectric plate 13 and the metal plate (fin line) 12 is changed, and thus a center frequency in a pass band of the bandpass filter 10 can be changed.

In this embodiment, a first gear 15 is fixed to a tip of a support rod 14 for supporting the dielectric plate 13. When the first gear 15 is rotated, the dielectric plate 13 is also rotated at the same time.

That is, the above-mentioned bandpass filter 10 according to the first embodiment includes a filter casing 17 (FIGS. 4A and 4B) defining the rectangular waveguide 11 having the narrow plane "a" and the broad plane "b" that is wider than the narrow plane "a", the metal plate 12 having a ladder shape and being arranged in a sandwiched manner inside the filter casing 17 at the center of the broad plane "b" so as to be parallel to the narrow plane "a", the dielectric plate 13 positioned in a vicinity of the metal plate 12 in the rectangular waveguide 11, the support rod 14 extending in parallel to a longitudinal direction of the rectangular waveguide 11, the support rod 14 being rotatably supported on the filter casing 17 and configured to support the dielectric plate 13 so that the dielectric plate 13 extends in the longitudinal direction of the rectangular waveguide 11, and the first gear 15 fixed at the tip of the support rod 14. The dielectric plate 13 is rotated along with rotation of the first gear 15, and thus a bandpass frequency is adjusted.

In the first embodiment described above, a spur gear is exemplified and illustrated as a type of the first gear 15, but any type of gears may be employed. That is, the first gear 15 is not limited to a spur gear. For example, a bevel gear may be employed.

With reference to FIGS. 3, 4A, and 4B, the above-mentioned bandpass filter 10 according to the first embodiment is described in detail.

In FIG. 4B, the second gear 16 is further meshed with the first gear 15 provided on the support rod 14, and a part of the second gear 16 is exposed to an outside of the filter casing 17 so as to enable the second gear 16 to be rotated and operated (driven). The number of teeth N(G2) of the second gear 16 serving as a drive gear is smaller than the number of teeth N(G1) of the first gear 15 serving as a driven gear. With this configuration, the second gear (drive gear) 16 meshing with the first gear 15 has a reduction gear ratio represented by {N(G1)/N(G2)}. The reduction gear ratio is selected as appropriate, and thus an appropriate changing step can be performed with respect to a change in the center frequency.

On the first gear 15, there is provided a rotation guide 18 (FIG. 3) that rotates in synchronization with the first gear 15.

With reference to FIG. 3, the rotation guide 18 has indications of changeable frequencies or symbols and graduations capable of specifying the changeable frequencies and a passable frequency range.

The rotation guide 18 enables a user to confirm a rotation amount from a filter top surface 19, and the user performs changing of a frequency with the second gear 16 while referring to the rotation guide 18.

With reference to FIG. 4B, on the second gear 16, a flat spring 20 for locking rotation is provided at a position of engagement with the second gear 16.

When the second gear 16 is rotated, the flat spring 20 is released upward at a crest portion of the second gear 16, and the flat spring 20 engages with the second gear 16 at a root portion of the second gear 16. Accordingly, during rotation of the second gear 16, the flat spring 20 is caught in each root of the second gear 16, and hence it is possible to obtain a click feeling during rotation of the second gear 16.

By the way, a seat 21 is provided below the flat spring 20, and a movable direction of the flat spring 20 is limited to an upward direction. With this configuration, the second gear 16 can be rotated only in such a direction that the flat spring 20 is movable freely, and a rotational direction of the second gear 16 is determined to one direction. In FIG. 4B, the second gear 16 can be rotated only in a clockwise direction.

As described above, the drive gear (second gear) 16 meshing with the first gear 15 is formed of a spur gear having a reduction gear ratio, and the above-mentioned rotational direction limitation and the above-mentioned clicking mechanism are attained by a ratchet mechanism formed by a tip (claw) of the flat spring 20 and teeth of the second gear 16.

Further, a screw 22 is provided above the flat spring 20. When the screw 22 is fastened, upward movement of the flat spring 20 is restricted, and hence rotation of the second gear 16 can be locked (FIG. 4A).

With reference to FIG. 4B, according to the first embodiment described above, the screw 22 provided above the flat spring 20 is unfastened, and the second gear 16 is rotated. In this manner, the dielectric plate 13 provided inside the bandpass filter is rotated, to thereby change the frequency. Further, the rotation guide 18 (FIG. 3) to be operated in synchronization with the first gear 15 is provided, and hence it is possible to easily set the frequency to a desired frequency while confirming the frequency on the rotation guide 18.

The frequency is changed in a stepped manner based on a gear ratio between the first gear 15 and the second gear 16. When the second gear 16 is rotated, the click feeling is obtained by the flat spring 20 in every single step, which enhances operability.

After changing the frequency, as illustrated in FIG. 4A, the screw 22 provided above the flat spring 20 is only fastened. Thus, the flat spring 20 keeps a rotational position of the second gear 16, and the frequency can be fixed.

As described above, the above-mentioned bandpass filter 10 according to the first embodiment includes the second gear 16 meshing with the first gear 15, and the second gear 16 has a smaller number of teeth than the first gear 15. The first gear 15 is rotated along with rotation of the second gear 16, and thus the dielectric plate 13 is rotated, to thereby adjust the bandpass frequency.

In addition, the above-mentioned bandpass filter 10 according to the first embodiment includes the spring 20 for locking rotation, which is provided at a position of engagement with the second gear 16, and the screw 22 provided above the spring 20. When the screw 22 is fastened, movement of the spring 20 is fixed by the screw 22 in a state in which the tip of the spring 20 engages with the second gear 16, and thus rotation of the second gear 16 is locked. When the screw 22 is unfastened, movement of the spring 20 is freed, and thus locking of rotation of the second gear 16 is released.

Further, the above-mentioned bandpass filter 10 according to the first embodiment includes the rotation guide 18 that is provided on an outer surface of the filter casing 17 so as to rotate in synchronization with the first gear 15. The rotation guide 18 has the graduations (symbols) for visual confirmation of the rotation amount of the first gear 15.

In the first embodiment described above, a spur gear is exemplified and illustrated as a type of the second gear 16, but any type of gears may be employed. That is, the second gear 16 is not limited to a spur gear. For example, a bevel gear may be employed.

In the first embodiment described above, the flat spring 20 is employed for locking the second gear 16, but any type of springs may be employed as long as the springs realize the same function.

According to the first embodiment described above, inexpensive and readily available components such as the dielectric plate, the support rod, the first gear, and the second gear are only added to the fin line filter including the metal plate (fin line) having a ladder shape, and thus the bandpass filter can be realized easily at low cost.

It is not necessary to prepare the metal plate (fin line) having a ladder shape for every frequency, and hence the metal plate (fin line) can be used as a shared component. Further, a size of the component can be reduced, and hence the fin line filter can be realized as an equivalent of a normal fin line filter in terms of contour.

Second Embodiment

Figure 5A:
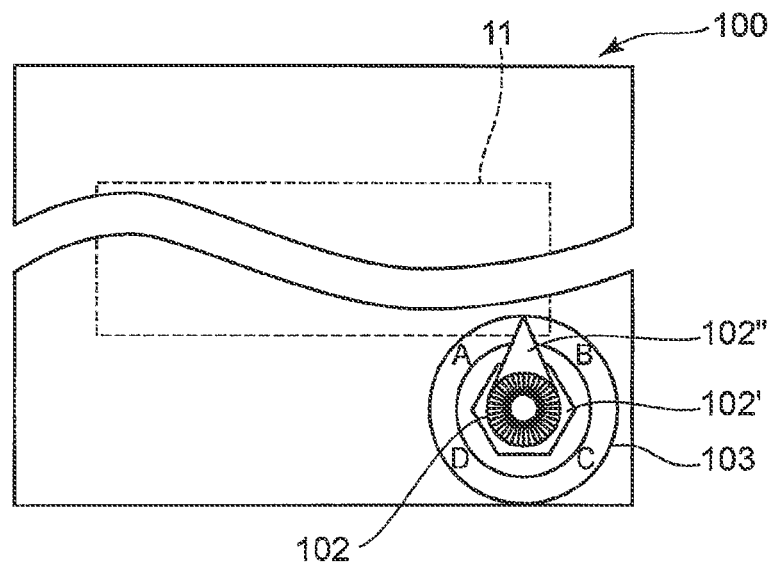
FIG. 5A is a top view of a bandpass filter according to a second embodiment of this invention.
Figure 5B:
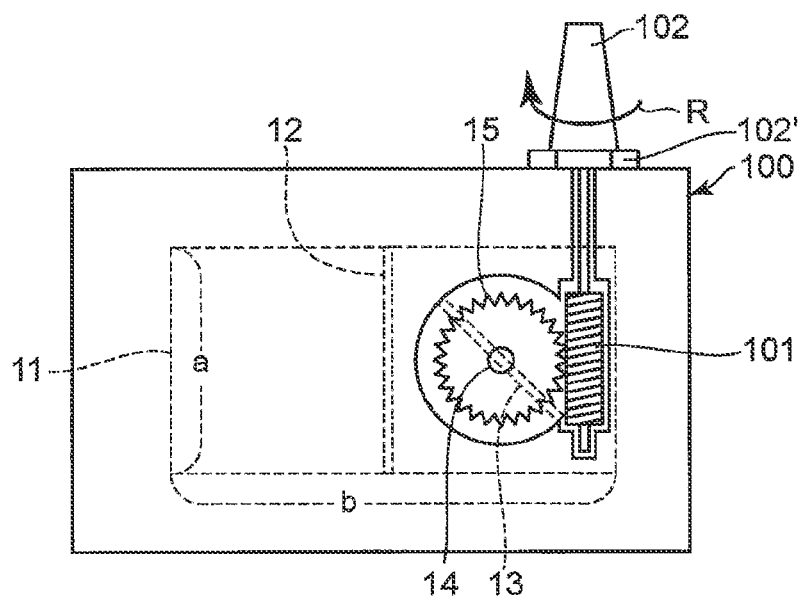
FIG. 5B is a side view of the bandpass filter according to the second embodiment.

With reference to FIGS. 5A and 5B, a bandpass filter 100 according to a second embodiment of this invention is illustrated. FIG. 5A is a top view of the bandpass filter 100, and FIG. 5B is a side view of the bandpass filter 100. The bandpass filter 100 also includes a rectangular waveguide 11 similar to the rectangular waveguide 11 of the bandpass filter 10 illustrated in FIGS. 1 and 2. The rectangular waveguide 11 of the bandpass filter 100 has internal structure similar to the internal structure of the rectangular waveguide 11 of the bandpass filter 10 illustrated in FIG. 2.

In the bandpass filter 100, a worm gear 101 is employed instead of the second gear 16 illustrated in FIGS. 4A, 4B, and 1. A tip of a center shaft of the worm gear 101 is connected to a multi-rotary dial 102, and the multi-rotary dial 102 is rotated in a direction of the arrow R (FIG. 5B). Thus, the worm gear 101 is rotated.

Along with rotation of the worm gear 101, the first gear 15 is rotated, and then the dielectric plate 13 connected to the first gear 15 is rotated. In this manner, a center frequency in a pass band of the bandpass filter 100 can be changed. The multi-rotary dial 102 includes a locking mechanism 102'. When changing the center frequency, the locking mechanism 102' is unfastened. After changing the center frequency to a desired center frequency, the locking mechanism 102' is locked. In this manner, the center frequency after change is kept.

The multi-rotary dial 102 includes a meter 102". While referring to the meter 102", a user rotates the multi-rotary dial 102 to obtain a desired center frequency. A relationship between the meter 102" and the center frequency is previously recognized, and a rotation guide 103 having symbols and graduations capable of identifying the center frequency is provided. Thus, the center frequency can be changed smoothly.

That is, the above-mentioned bandpass filter 100 according to the second embodiment includes the second gear meshing with the first gear 15, and the second gear is formed of the worm gear 101. A driving knob for driving the worm gear 101 is provided on an outer surface of the filter casing, and the driving knob is formed of the multi-rotary dial 102.

In the second embodiment described above, the multi-rotary dial 102 is employed, but this invention is not limited to the multi-rotary dial 102. Any component may be employed as long as the component has the same function as that of the multi-rotary dial 102.

In the second embodiment described above, the multi-rotary dial 102 is rotated and operated on a filter top surface, but a surface on which the multi-rotary dial 102 is rotated and operated is not limited to the top surface.

According to the second embodiment described above, inexpensive and readily available components such as the dielectric plate, the support rod, the first gear, and the worm gear are only added to the fin line filter including the metal plate (fin line) having a ladder shape, and thus the bandpass filter can be realized easily at low cost.

It is not necessary to prepare the metal plate (fin line) having a ladder shape for every frequency, and hence the metal plate (fin line) can be used as a shared component.

Further, a size of the component can be reduced, and hence the fin line filter can be realized as an equivalent of a normal fin line filter in terms of contour.

In addition, in the second embodiment described above, the worm gear 101 is employed, and hence the first gear 15 can be rotated continuously. Accordingly, the frequency can be finely adjusted, and the worm gear 101 is effective particularly for a case where strict frequency setting is needed, a case of application to a bandpass filter having a narrow pass band, and the like.

INDUSTRIAL APPLICABILITY

The invention of the subject application is described above in detail with reference to the embodiments, but the invention of the subject application is not limited to the above-mentioned embodiments. Various modifications that a person skilled in the art can understand may be made to the configuration and details of the invention of the subject application within the scope of the invention of the subject application.

Further, this application is based on and claims the benefit of priority from Japanese Patent Application No. 2012-132585, filed on Jun. 12, 2012, the disclosure of which is incorporated herein by reference in its entirety.

The invention claimed is:

1. A bandpass frequency adjusting method to be used in a bandpass filter, the bandpass filter comprising:
   a filter casing defining a rectangular waveguide having a narrow plane and a broad plane that is wider than the narrow plane;
   a metal plate having a ladder shape and being arranged in a sandwiched manner inside the filter casing at a center of the broad plane so as to be parallel to the narrow plane;
   a dielectric plate positioned in a vicinity of the metal plate in the rectangular waveguide; and
   a support rod extending in parallel to a longitudinal direction of the rectangular waveguide, the support rod being rotatably supported on the filter casing and configured to support the dielectric plate so that the dielectric plate extends in the longitudinal direction of the rectangular waveguide;
   a first gear fixed at a tip of the support rod;
   a second gear meshing with the first gear, the second gear having a smaller number of teeth than the first gear,
   a spring for locking rotation, which is provided at a position of engagement with the second gear; and
   a screw provided above the spring,
   wherein the bandpass frequency adjusting method comprises
   rotating the first gear along with rotation of the second gear to rotate the dielectric plate, to thereby adjust the bandpass frequency, and
   when the screw is fastened, fixing movement of the spring by the screw in a state in which a tip of the spring engages with the second gear, to thereby lock rotation of the second gear, and
   when the screw is unfastened, freeing movement of the spring, to thereby release locking of the rotation of the second gear.

2. The bandpass frequency adjusting method according to claim 1,
   wherein the second gear comprises a worm gear, and
   wherein the bandpass frequency adjusting method further comprises rotating the first gear along with driving of the worm gear to rotate the dielectric plate, to thereby adjust the bandpass frequency.

3. A bandpass filter, comprising:
   a filter casing defining a rectangular waveguide having a narrow plane and a broad plane that is wider than the narrow plane;
   a metal plate having a ladder shape and being arranged in a sandwiched manner inside the filter casing at a center of the broad plane so as to be parallel to the narrow plane;
   a dielectric plate positioned in a vicinity of the metal plate in the rectangular waveguide;
   a support rod extending in parallel to a longitudinal direction of the rectangular waveguide, the support rod being rotatably supported on the filter casing and configured to support the dielectric plate so that the dielectric plate extends in the longitudinal direction of the rectangular waveguide;
   a first gear fixed at a tip of the support rod;
   a second gear meshing with the first gear, the second gear having a smaller number of teeth than the first gear, wherein the first gear is rotated along with rotation of the second gear to rotate the dielectric plate, to thereby adjust the bandpass frequency;
   a spring for locking rotation, which is provided at a position of engagement with the second gear; and
   a screw provided above the spring,
   wherein, when the screw is fastened, movement of the spring is fixed by the screw in a state in which a tip of the spring engages with the second gear, to thereby lock rotation of the second gear, and
   wherein, when the screw is unfastened, movement of the spring is freed, to thereby release locking of the rotation of the second gear.

4. The bandpass filter according to claim 3, further comprising a rotation guide provided on an outer surface of the filter casing so as to rotate in synchronization with the first gear, the rotation guide having graduations for visual confirmation of a rotation amount of the first gear.

5. The bandpass filter according to claim 3, wherein the second gear comprises a worm gear, and
   the bandpass filter further comprises a driving knob provided on an outer surface of the filter casing so as to drive the worm gear, the driving knob comprising a multi-rotary dial.

* * * * *